United States Patent [19]

Uurtamo

[11] Patent Number: 5,770,977
[45] Date of Patent: Jun. 23, 1998

[54] MICROWAVE FREQUENCY SYNTHESIZER WITH ULTRA-FAST FREQUENCY SETTLING AND VERY HIGH FREQUENCY RESOLUTION

[75] Inventor: Stephen J. Uurtamo, Dallas, Tex.

[73] Assignee: Texas Instruments Incorporated, Dallas, Tex.

[21] Appl. No.: 719,752

[22] Filed: Sep. 25, 1996

[51] Int. Cl.$^6$ .................................................. H03B 19/00
[52] U.S. Cl. ............................... 331/40; 331/43; 331/77; 331/179; 327/105
[58] Field of Search ................................ 331/1 A, 16, 18, 331/19, 25, 34, 37, 40–43, 77, 175, 179; 327/105–107

[56] References Cited

U.S. PATENT DOCUMENTS

| | | | |
|---|---|---|---|
| 4,882,549 | 11/1989 | Galani et al. | 331/14 |
| 5,146,186 | 9/1992 | Vella | 331/16 |
| 5,321,401 | 6/1994 | White | 341/147 |
| 5,343,168 | 8/1994 | Guthrie | 331/16 |
| 5,471,661 | 11/1995 | Atkinson | 331/17 X |
| 5,508,661 | 4/1996 | Keane et al. | 331/19 X |

Primary Examiner—David Mis
Attorney, Agent, or Firm—René E. Grossman; Richard L. Donaldson

[57] ABSTRACT

The ability to achieve ultra-fast frequency settling times with good frequency resolution and high absolute accuracy over significant bandwidth at microwave frequencies ranging over three octaves. The implementation is an open-loop system requiring little or no compensation of temperature. This is accomplished by providing a frequency doubled direct digital synthesizer output to up/down convert a microwave frequency source. A special tracking filter architecture coupled to the microwave source provides the suppression of unwanted products. Fixed frequency set-on and swept bandwidths in excess of 300 MHz have been demonstrated. This is accomplished by using a direct digitally synthesized quadrature phased carrier which can be set to any frequency within a 350 MHz bandwidth to coherently up/down convert a low phase-noise microwave frequency to the sum or the difference frequency product. Individual control of differential phase and amplitude over frequency assures very high suppression of unwanted products without the use of additional filtering.

14 Claims, 6 Drawing Sheets

MICROWAVE FREQUENCY SYNTHESIZER WITH ULTRA-FAST FREQUENCY SETTLING AND VERY HIGH FREQUENCY RESOLUTION

BACKGROUND OF THE INVENTION

1. Field of the Invention

This invention relates to an apparatus and method for generating low power microwave frequencies having ultra fine control of frequency resolution combined with extremely short frequency settling time.

2. Brief Description of the Prior Art

The current art for generation of low power microwave frequencies includes two common types of oscillator frequency control which are adaptable to either open or closed loop architectures. These oscillator types are the yttrium-iron-garnet (YIG) tuned oscillators (YTOs) and voltage tuned oscillators (VTOs), both of which are often utilized in an open loop control configuration. Phase locked loops (PLLs) utilize either of these oscillators in a closed loop architecture as a common means for achieving high frequency resolution and stability with the penalty of significantly increased settling time.

YIG tuned oscillators (YTOs) can tune over wide ranges of microwave frequencies, often over multiple frequency octaves. YTOs are limited in their tuning speed and settling time by the physics of the magnetics which establishes the flux that changes the resonant frequency of the YIG sphere which is the integral resonator of the YTO circuit. Tuning is performed by passing a control current through a main tuning coil that directly affects the magnetic flux. However, the time response of the magnetic circuit causes the slow tuning and frequency settling characteristics associated with YTOs. These times are on the order of one to several milliseconds, depending upon the size of the commanded frequency change and required stability of the settled frequency. Most YTOs also incorporate a smaller FM coil which directly interacts with the YIG sphere for rapid tuning over a small range, typically <±100 MHz. This coil is often used to sweep the frequency of the YTO.

The magnetic tuning structure of both of these coils also exhibits a hysteresis characteristic, common to magnetics, which causes the oscillator to exhibit an apparent change in frequency as the device is first tuned upward and then downward. This contributes to uncertainty in the commanded frequency.

The current/frequency transfer characteristic for both the main and FM tuning coils is linear with a constant rate of change. However, the YIG resonators are very temperature dependent, requiring an oven structure to elevate their internal temperatures to maintain frequency stability. Overall, this class of oscillators exhibits frequency uncertainties due to temperature, hysteresis and non-linearity of >30 to 40 MHz when operated with temperature control in an open loop architecture.

Resolution of frequency set-on depends upon the ability to control the current supplied to the tuning coils. This is often accomplished by converting digital control commands into requisite control currents for the tuning coils with frequency compensations often effected by digital corrections ahead of this conversion process. In a closed loop configuration, a YTO can be stabilized to a reference oscillator with the YTO frequency very accurately known and stability comparable to its reference. This is obtained at the expense of significantly slower frequency settling characteristics.

Another class of electrically tunable oscillators are broadly known as Voltage Controlled Oscillators (VCOs) or Voltage Tunable Oscillators (VTOs). Wide bandwidth frequency control of this type of oscillator required the application of abrupt or hyperabrupt varactor diodes as their voltage dependent tuning element. Abrupt varactor tuned oscillators are tunable over a frequency range of one octave or less with a significantly non-linear control voltage characteristic, often requiring large control voltages. Alternatively, hyperabrupt varactor tuned oscillators exhibit a relatively linear voltage tuning characteristic over about 45% of a frequency octave using modest control voltages. The settling time for either type of device is one to several microseconds, followed by a tendency for a temperature induced post tuning drift over the next succeeding several seconds, caused by the heating effect of the varactor tuning diode. These oscillators are also very temperature dependent and must be operated at an elevated temperature, using an oven to minimize temperature induced errors. Frequency resolution depends upon the ability to control the voltage used to tune the varactor diodes. This is often accomplished by digital quantization of the control voltage with requisite compensations and corrections performed digitally.

With digital and/or analog error compensation, an ovenized VTO can achieve a two to five megahertz frequency control accuracy using a simple open loop control architecture. In a closed loop configuration, the VTO can be stabilized to a reference oscillator frequency at the penalty of slower frequency settling characteristics. A further consideration is that the modulation sensitivity (MHz/volt) of the VTO which changes dramatically over the controllable frequency range of the VTO, being less sensitive at higher frequencies. This requires the provisions for a second control circuit to maintain independent compensation to assure a constant modulation characteristic.

If high frequency set-on accuracy and stability are required, then a PLL architecture using YIGs or VTOs as microwave sources is commonly used as a closed loop means of control. However, the settling time of a PLL is determined by the time response characteristic of the control loop which, at best, is about one hundred times the inverse of the frequency resolution increment. Thus, as the frequency resolution increments decrease, the settling time increases very rapidly. Once locked, however, a PLL retains the temperature stability of its frequency reference oscillator and does not require additional analog or digital compensation.

While YTOs and VTOs are self resonant at microwave frequencies, the application of PLLs at these frequencies requires a coherent microwave frequency reference to down-convert the output frequency of the controlled oscillator (YTO or VTO) to frequencies (digital clock rates) which are compatible with the digital counter components used in the control loop. This reference frequency is usually obtained from a comb generator that is coherent with the reference oscillator. The spurious frequency content of a properly designed phase locked loop is extremely small and approaches that of the reference oscillator.

Direct digital synthesizers (DDSs) utilize digital signal processing technology embedded into special integrated components configured to create a single frequency output for each digital input frequency command. A DDS is implemented as a digital phase accumulator, synchronously clocked by a stable oscillator. The DDS output addresses a read only memory (ROM), modulo output frequency. This ROM contains fine grain sine wave data which is converted to an analog output by a digital-to-analog (D/A) converter whose low pass filtered output is an RF carrier at the programmed frequency. This technique is commonly used at frequencies well below 100 MHz for high precision receivers and the like. Due to the sampled digital nature of the DSSs, the frequency output of this class of oscillator exhibits very large spurious content, dependent upon the fractional relationship of the commanded frequency to the input clock rate. Generally, DDSs are limited to command frequencies which are less than 0.4 of the clock frequency. Above this value and particularly at commands approaching one half the clock frequency, the spurious content becomes very large and makes the output unusable. DDS oscillators operating at frequencies above 100 MHz generally can only be commanded to frequencies which are less than one fourth the clock frequency to keep spurious content to minimum values.

Frequency synthesizers are generically classed as direct or indirect based their need for an open or closed control loop.

The preferred embodiment leverages the phase coherent, ultra fast frequency switching characteristics of the DDS into a simple, frequency coherent, direct synthesis architecture which does not require closed loop control to achieve its purity of its coherent output signal.

SUMMARY OF THE INVENTION

In accordance with the present invention, a special variant of the direct digital synthesizer (DDS) architecture is implemented which is optimal for achieving ultra fast frequency settling times, very fine commandable frequency resolution and stability related to an external reference in an open loop control architecture. The preferred embodiments also feature the ability to adaptively reduce unwanted spectral outputs from the synthesizer using a minimum number of components. A preferred embodiment of a DDS provides an output frequency of 35 to 195 MHz when operated at a clock frequency of 800 MHz having only a single ended output (vs. I & Q). The single ended DDS output is passively doubled to obtain the required 70 to 390 MHz IF used in the frequency conversion process. It is necessary to limit the DDS output frequency to, for example, less than 200 MHz when using an 800 MHz clock, or one fourth of the DDS clock frequency for control of the major spectral spurious content. This operation at reduced frequencies assures minimal spurious content at the IF prior to up conversion. This operation is further enhanced by the provision of high and low pass filtering to shape the noise bandwidth at the inputs of the subsequent amplifiers to further minimize the feedthrough of unwanted components at IF. The frequency doubled DDS output is passed to a wideband microwave mixer for up-conversion to a final commandable frequency.

The RF port of a microwave mixer is driven with a single frequency obtained from a YIG tuned harmonic generator. With the IF port driven by the DDS derived IF output, the local oscillator (LO) port of the microwave mixer contains remnants of the RF carrier and the resulting upper and lower sidebands due to the up-conversion (direct frequency synthesis) process. A YIG tuned tracking filter removes-all of these undesired remnants except the selected sideband which is amplified and output. This tracking filter is of particular significance because it is built on the same polepiece as the YIG harmonic generator filter. Thus, both of these filters have identical coarse frequency tuning characteristics which precisely track one another within their output bandwidth over temperature. The output filter is also fine tuned by a very fast secondary tuning coil which introduces the frequency offset of the DDS frequency selection. The extremely small size contributes to the extremely high tuning speeds which the overall fast oscillator exhibits.

Both filters are digitally controlled using tuning words which are aligned with the DDS. Thus, frequency offset commands set to the DDS similarly introduce the proper offset frequency relationships at the output with no additional calculation or compensation.

A second embodiment utilizes a DDS design which provides the in phase and quadrature phase (I & Q) outputs, also known as the quadrature RF outputs, at frequencies up to 400 MHz when used with a one GHz clock oscillator. The second embodiment provides the ability to independently control the incremental differential phase relationships of the I and Q outputs for suppression of unwanted signal outputs with the ability to provide special phase modulations. When used with an image rejection mixer (IRM), the preferred embodiment provides selection of either upper or lower sideband frequency outputs with frequency adaptive suppression of the RF carrier and unwanted sideband without the need for significant filtering at the RF output. This represents a significant reduction in system design complexity.

The present invention provides the capability of selecting a frequency with less than one hertz resolution over a 400 MHz bandwidth in any 20 MHz bandwidth signal with settling times of under 50 nanoseconds, regardless of the resolution, utilizing DDS in an open loop architecture. The preferred embodiment achieves settling time to final frequency value that are from about forty to about eighty times faster than any other conventional architecture for larger commanded steps of RF frequency. The preferred embodiment remains phase coherent during any change of frequency and adaptively suppresses all unwanted signals without the need of additional output filtering.

DESCRIPTION OF THE PREFERRED EMBODIMENT

Figure 1:
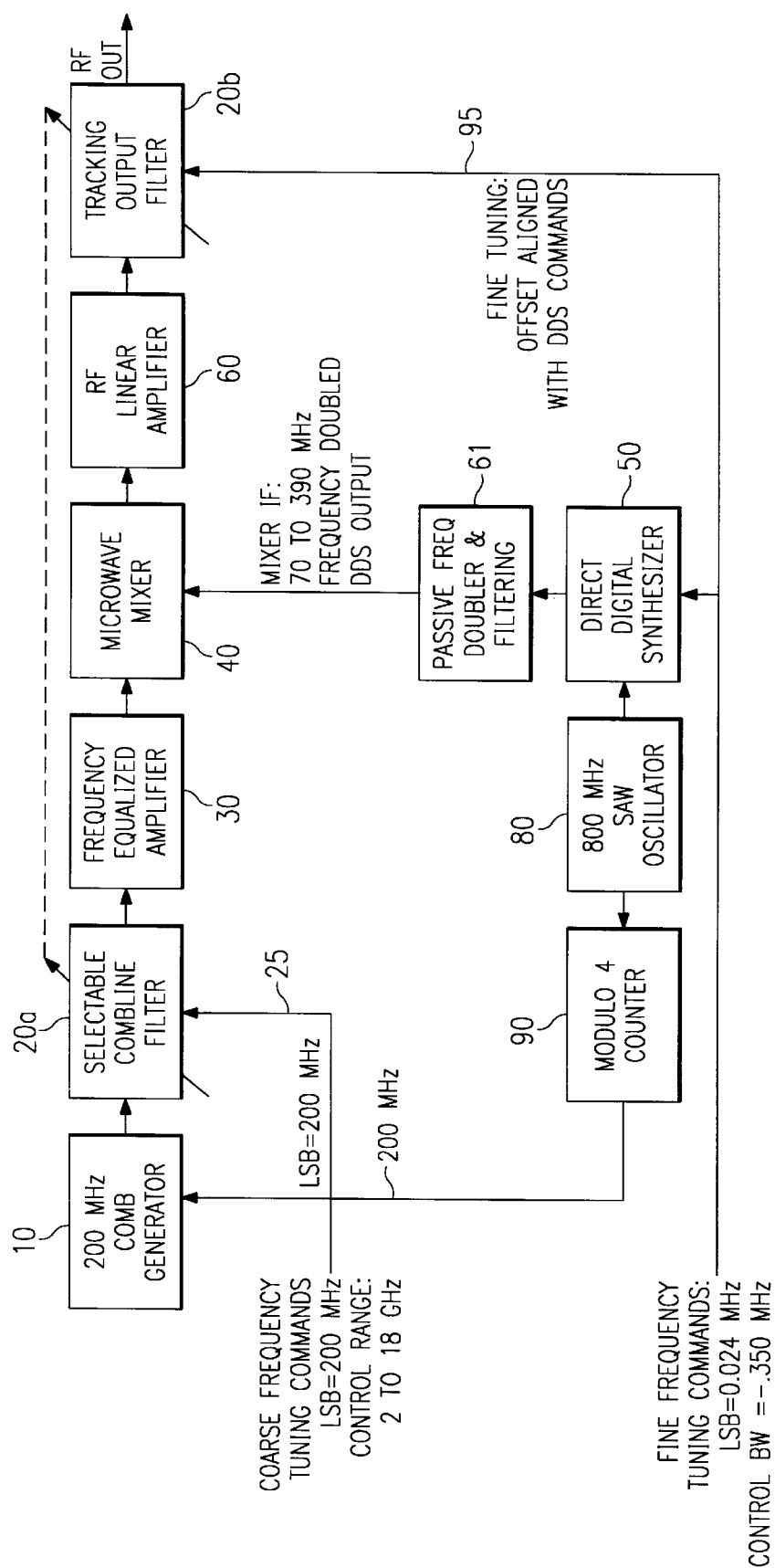
FIG. 1 is a block diagram of a microwave frequency synthesizer in accordance a first embodiment of the present invention.

Referring now to FIG. 1, there is shown a block diagram of a first embodiment of the present invention. A high quality surface acoustic wave (SAW) oscillator 80 provides a low noise source of fundamental RF energy. The frequency of oscillator 80 is divided by four by a high speed modulo four digital counter 90 which is incorporated into the DDS chip discussed hereinbelow. This provides the frequency reference for the comb generator 10 and selectable combline filter 20A. The comb generator 10 outputs a series of frequency pickets related to the integer multiplier of its frequency input. These pickets are separated by a YIG tuned, bandpass filter 20A to select a single frequency picket (or combline) from the continuous spectral output of the comb generator 10 based upon a signal on line 25 which is an externally provided digital signal for coarse frequency tuning commands to select a picket within the frequency range of generator 10. Frequency equalized amplifier 30 raises the output level of the harmonic generator to be compatible with the input of a standard wide band microwave mixer 40. Because the amplitude of the harmonic generator diminishes as the frequency increases, the overall gain of amplifier 30 is frequency equalized to yield a relatively constant output power at any selected picket. The frequency equalized linear amplifier 30, wherein gain decreases with increase in frequency and vice versa, amplifies the selected combline to a high level RF compatible with input requirements of microwave mixer 40.

Figure 7:
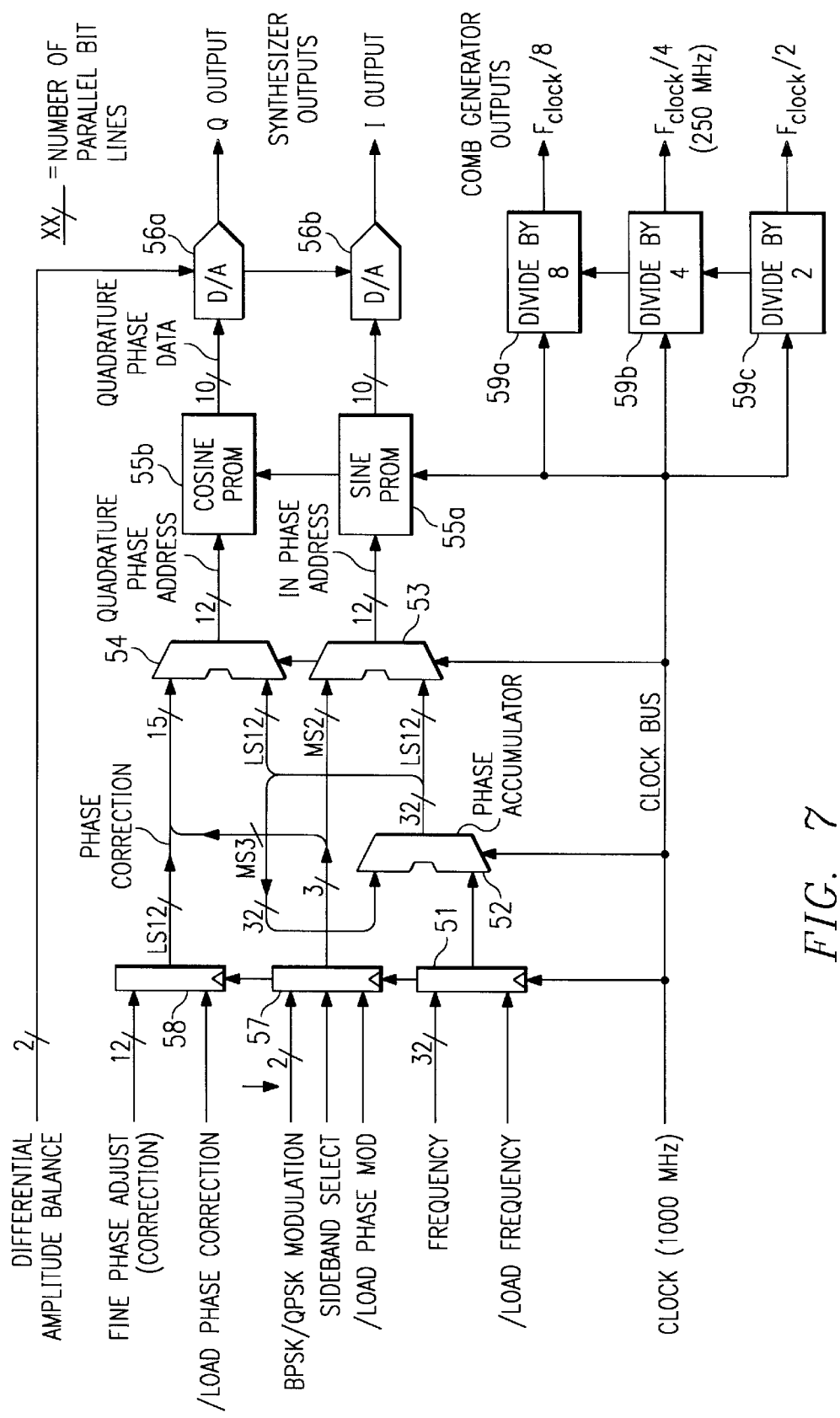
FIG. 7 is a block diagram showing the implementation of the direct digital synthesizer integrated circuit in accordance with the present invention.

A direct digital synthesizer (DDS) 50, an example of which is shown in FIG. 7, provides very fine frequency resolution with ultrafast set-on time. Synthesizer 50 receives its clock signal from the oscillator 80 which establishes its overall commandable frequency range. The DDS 50 frequency commands are limited to less than one fourth of the clock frequency to minimize in-band spurious responses, preferably to less than 195 MHz. The output of DDS 50 is bandpass filtered and passively doubled in frequency and again bandpass filtered in doubler and filter 61 to achieve the required IF offset frequency range for the microwave mixer to minimize noise and any other spurious harmonic relationships present.

Figure 2:
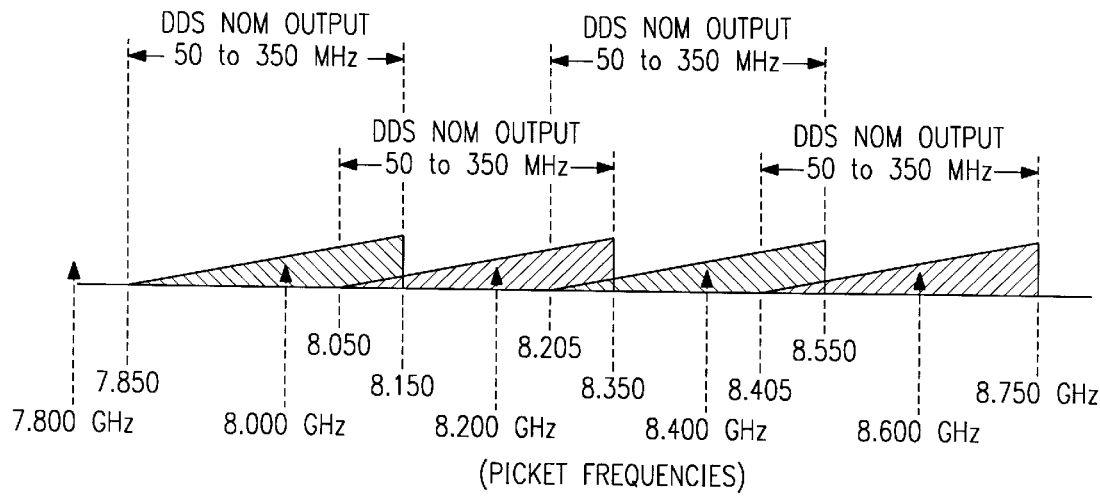
FIG. 2 is a pictorial diagram of the remaining RF products after filtering by filter 20b.

Microwave mixer 40 combines the selected microwave harmonic and IF inputs to yield upper and lower sidebands displaced by the IF with a remnant of the RF harmonic. The overall level of these frequencies is raised by a linear RF amplifier 60. The output filter 20B suppresses the unwanted sideband and RF products, leaving only the desired RF output. FIG. 2 pictorially shows these spectral relationships.

Figure 3:
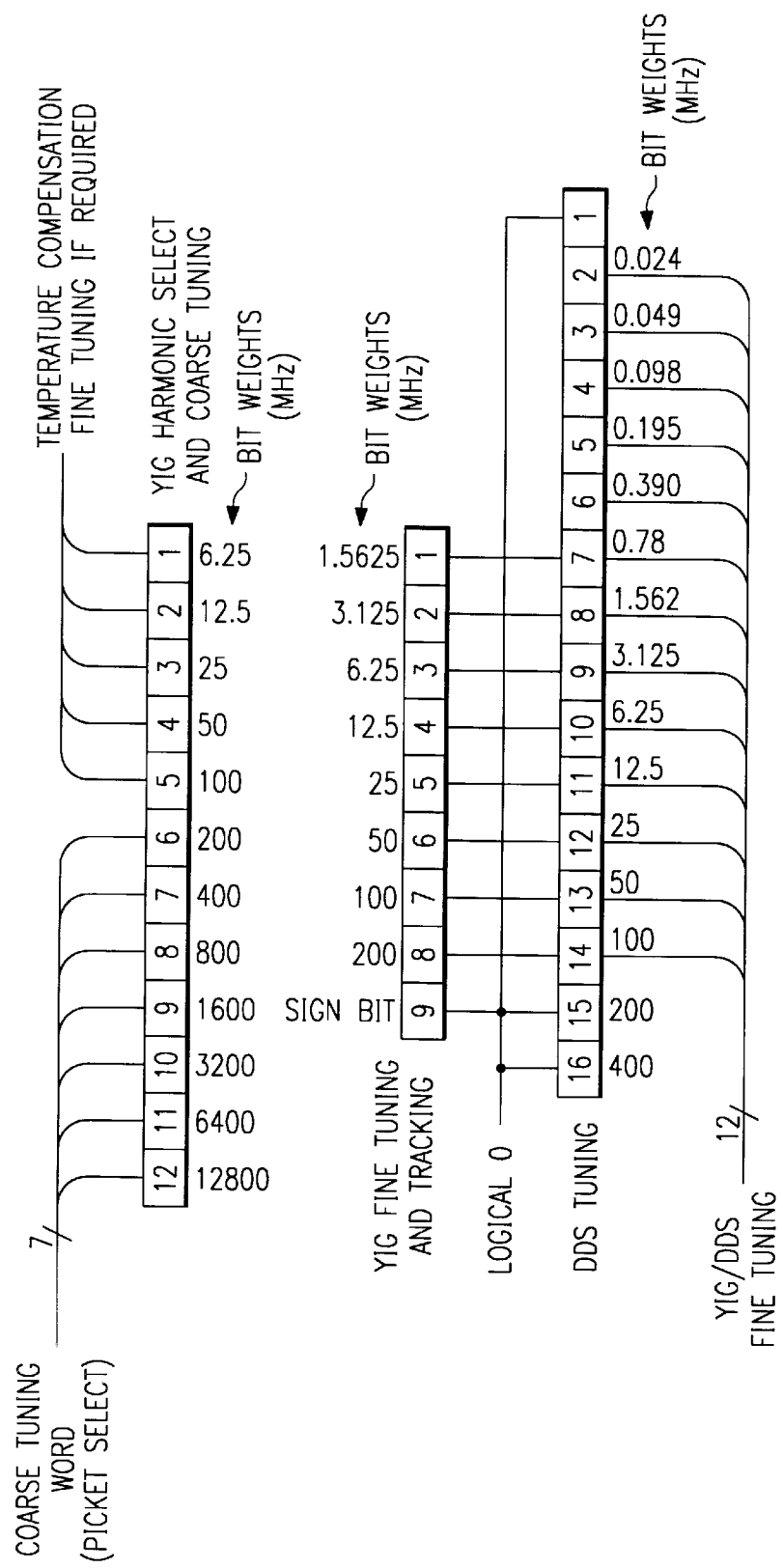
FIG. 3 is pictorial diagram showing coordinated digital control of the DDS and RF filters.

The tracking filter assembly 20A and 20B is a very special implementation of a YIG tuned filter. Both of these isolated filter sections are built on the same magnetic pole piece, this feature assuring that both filters 20A and 20B have identical magnetic tuning fluxes and thus the same center frequencies. The output filter section 20B has an additional fine tuning coil which is under the control of an externally provided digital signal for fine frequency tuning commands for biasing its YIG filter elements. The coil provides a locally adding or canceling magnetic field to the filter structure and, thus, a frequency offset to accommodate the IF offset. By digitally controlling this coil in exact unison with the DDS frequency selection, precise tracking of this frequency offset is obtained as shown in FIG. 3.

Figure 4:
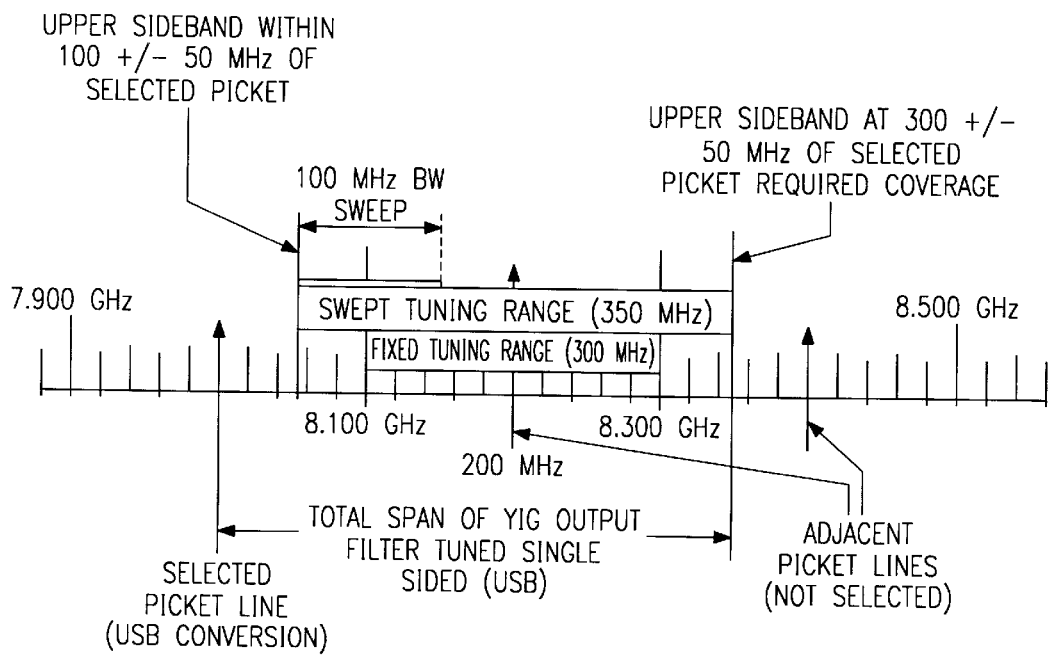
FIG. 4 is a pictorial diagram of a typical bandplan obtained by coordinating DDS frequency as an offset to a harmonic picket.

Because neither the main nor fine tuning has to be any more exact than its operational pass bandwidth, the proper mixing and output frequency selections do not require the complete settling required with the YIG oscillators. Thus, the output of synthesizer 50 can be tuned to new frequencies at very high rates, even though the YIG filters may not be completely settled. The only penalty is some variability in synthesizer output level during this period which is unimportant in the intended application. Thus, frequency settling has been traded for amplitude settling. Frequency sweep is obtained by digitally commanding a succession of closely spaced frequencies as shown in FIG. 3. The frequency bandplan requirements for the DDS 50 are shown in FIG. 4.

Figure 5:
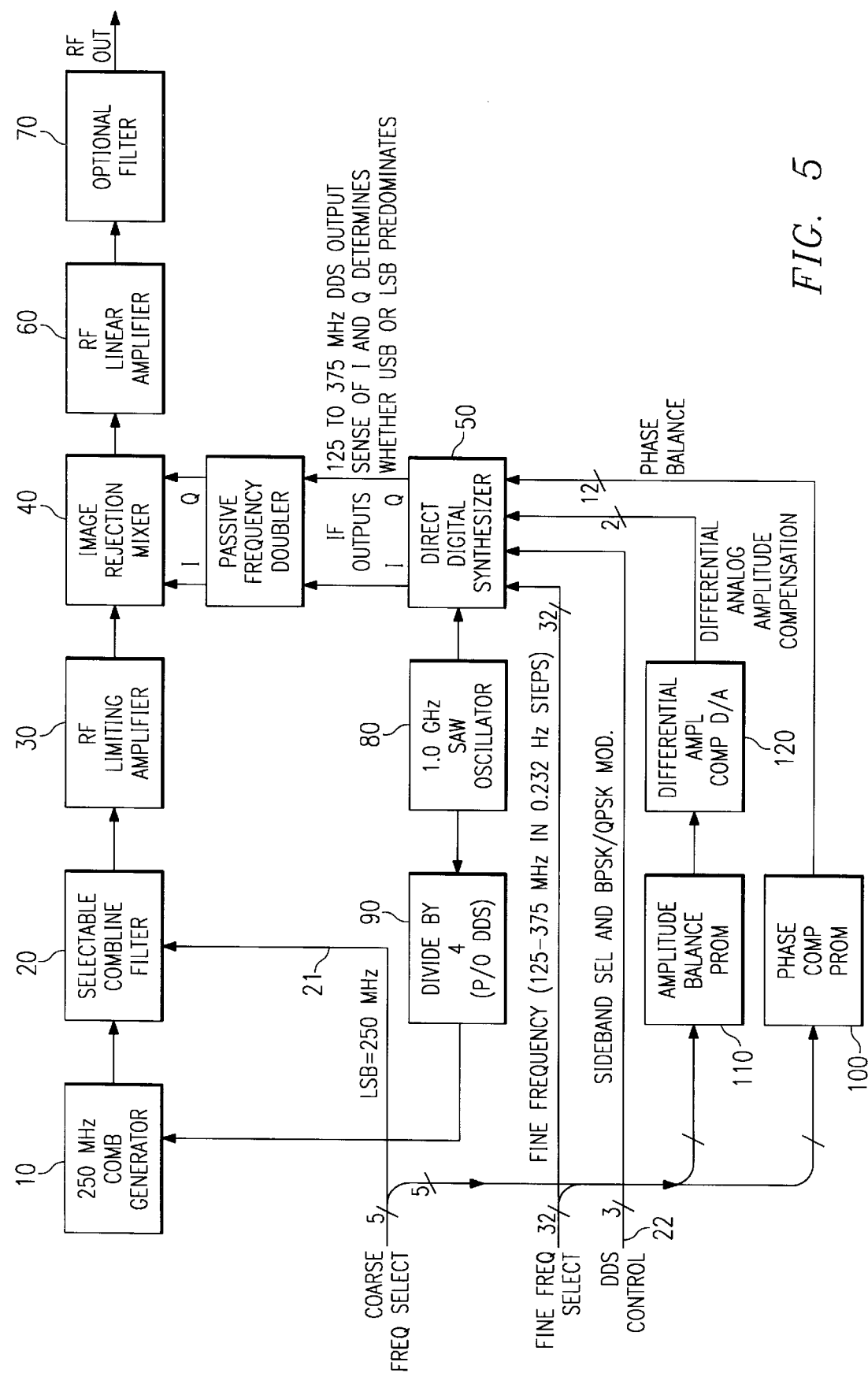
FIG. 5 is a block diagram of a microwave frequency synthesizer based upon an integrated direct digital synthesizer in accordance with an alternate embodiment of the present invention.

Referring now to FIG. 5, wherein like character references refer to the devices which are the same or similar to devices depicted in conjunction with FIG. 1, there is shown a block diagram of a second embodiment of a microwave frequency synthesizer based upon an integrated direct digital synthesizer (explained in detail with reference to FIG. 7) in accordance with the present invention. The synthesizer includes a 250 MHZ comb frequency generator 10, the output of which is a series of frequency pickets at intervals of 250 MHz. A selectable combline filter in the form of a bandpass filter 20 selects a single frequency picket (or combline) from the continuous spectral output of the comb generator 10 under control of the course frequency select line 21 which is an externally provided digital signal for coarse frequency tuning commands to select a picket within the frequency range of generator 10. The amplitude of the output from the comb generator 10 diminishes as the frequency of that output increases. A frequency equalized amplifier 30 amplifies the selected combline to a high level, independent of the apparent reduction in amplitude that is compatible with the RF input requirements of the image rejection mixer (IRM) 40 to which the amplified signal is passed.

Figure 6:
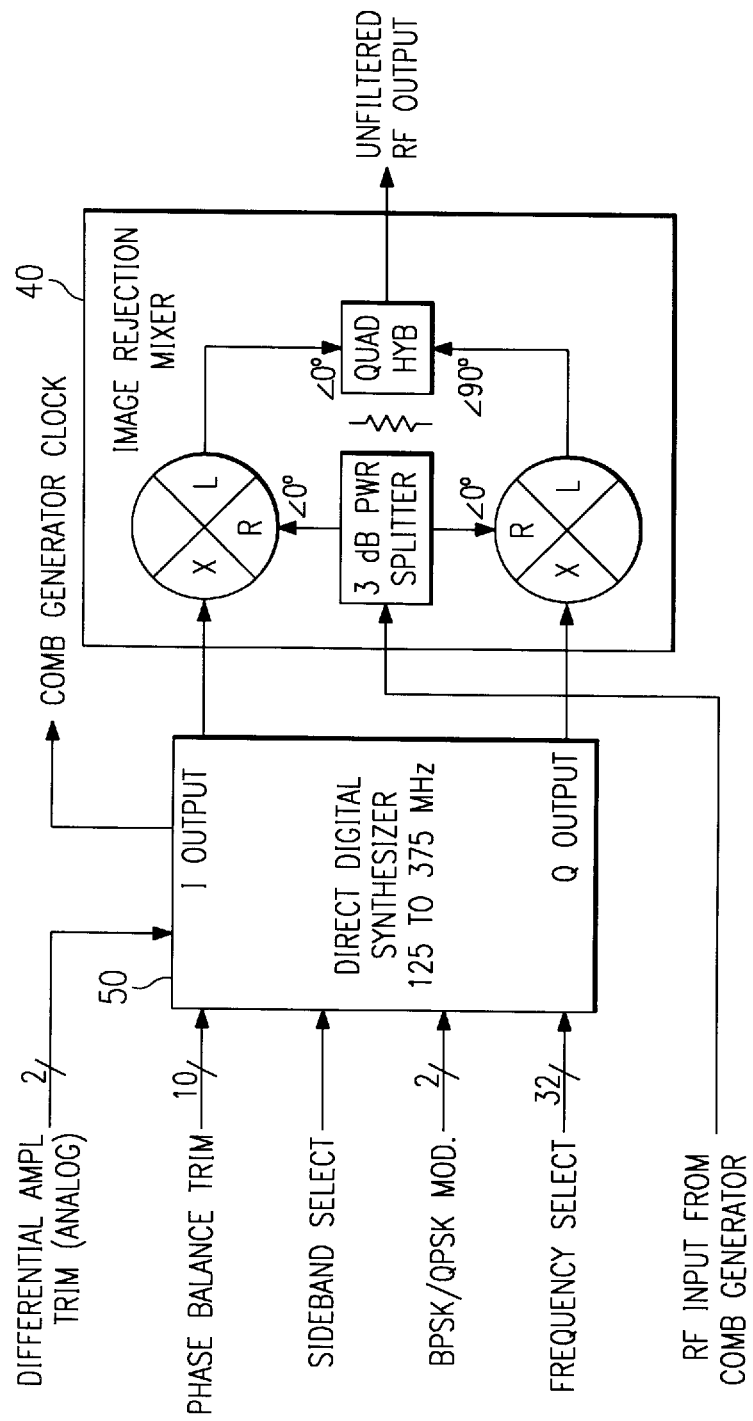
FIG. 6 is a block diagram showing the details of the image rejection mixer 40 of FIG. 5 used as a single sideband generator.

The IRM is an RF component that is configured for the preferred embodiment as a suppressed carrier, single sideband modulator and will be discussed in more detail hereinbelow in connection with FIG. 6. The output of IRM 40 is the product of the RF input thereto (R port) from amplifier 30 and the combined I & Q IF inputs (X ports) which are driven and provided by a DDS 50. In this configuration, the IRM 40 provides the capability of independently selecting either the lower sideband (the difference between the RF and IF frequencies) or the upper sideband (the sum of the RF and IF input frequencies).

The selected sideband is determined by the differential phase sense of the two IF inputs from the DDS 50. This sense is changed by a single bit selection passed as data to the DDS 50 via the DDS control line 22. The deselected sideband and the RF carrier are unwanted spectral products which must be suppressed. The level of this suppression is determined by the differential amplitude balance of the two IF outputs (I & Q) and their differential phase error from quadrature. It can be shown that achieving >50 dB rejection of these spurious products requires that the quadrature must be maintained to <one degree and the differential signal level within <0.2 dB. These corrections must be controlled adaptively as a function of selected upper or lower sideband frequency due to the non-linear characteristics of the IRM 40 combined with its frequency dependent mismatches.

Continuous adaptive compensation of both phase and differential amplitude are provided. Phase is compensated by adaptively adjusting the phase quadrature with compensatory data summed into the DDS 50 from a phase compensation programmable, read only memory (PROM) 100. The differential I & Q amplitudes are compensated by a second amplitude balance PROM 110 and a digital-to-analog (D/A) converter 120, the outputs of which differentially compensate the I and Q outputs of the DDS 50. This is accomplished by differentially adjusting the independent D/A reference voltage. Together, these two adaptive compensations yield a significant reduction in system complexity because the output filter 70 may be eliminated in many designs that have dynamic ranges of ~50 dB. The net result is a significant reduction of system size, weight and power.

The output of the IRM 50 is passed to an RF linear amplifier 60 which raises the output level to the required system power level. A tracking output filter 70 receives the output of the amplifier 60 and suppresses unwanted products and harmonics below the levels achieved by the adaptive process discussed above and is optional.

Significant to the second embodiment is the construction of the integrated direct digital synthesizer (DDS) 50 which is shown in detailed block diagram form in FIG. 7. The DDS includes a frequency input register 51 which allows the example 1000 MHz clock signal to be divided into $2^{32}$ parts or 0.232 Hz steps. The output of register 51 is passed to a phase accumulator 52 which is a clocked adder whose 32 bit output is passed to the sine and cosine synchronously clocked adders 53 and 54 respectively. The adders 53 and 54 allow the introduction of specified phase shift relationships between the quadrature channels necessary to implement the adaptive phase corrections and modulation. The twelve most significant bit outputs, MS12, of adders 53 and 54 are passed as phase data addresses to sine and cosine PROMs 55a and 55b respectively, which are identical. To achieve a 90 degree differential phase shift (I & Q) requires that the cosine phase address be changed at its two most significant (MS2) address positions. A +90 degree differential phase shift, which will select the upper sideband, requires adding 10 (binary) to these positions while the lower sideband is selected by subtracting the same value, 10 (binary), causing a −90 degree phase shift between the I & Q ports. These bit shifts only affect the cosine PROM 55b address. This data is synchronously latched by an input data latch 57. Phase correction is introduced as data from a synchronous latch 58 which is added or subtracted as a 2s complement at the 12 least significant (LS12) data bit positions of the phase accumulator data which is output by accumulator 52 and passed to the cosine PROM 55b only. Differential amplitude correction is performed by differentially affecting the voltage references for the two D/A converters 56a and 56b which are independently controlled.

The phase relationships generated by the DDS 50 which cause the IRM 40 to select the specified sideband and/or phase modulation are:

Selectable sideband generation:
Lower sideband: I<0°, Q<90° or I<0°, Q<−90°
Upper sideband: I<90°, Q<0° or I<0°, Q<90°

The suppression of the unwanted sideband to >−50 dBc requires that I and Q amplitudes be trimmed to equal amplitude within 0.2 dB. Differential phase error from quadrature must be within 2.0 degrees.

Bi-Phase Shift Keyed (BPSK) Modulation:
Both I and Q lines retain differential phase and amplitude relationships discussed above while both are rotated instantaneously to one of two modulation states (0°/180°).

Quadrature Phase Shift Key (QPSK) Modulation:
Both outputs retain differential phase and amplitude relationships discussed above while both are rotated instantaneously to one of four modulation states (0°/90°/180°/270°).

The DDS 50 is driven by a 1000 MHz clock 80 (FIG. 5) which is a fundamental frequency output of a surface acoustic wave (SAW) oscillator. This frequency is subdivided by a synchronous divide by four counter 90 which is identical to the divide by four output 59b of FIG. 7. This 250 MHz output is passed to the comb generator 20 (FIG. 5) as its reference. The DDS 50 also provides divide by 2 at 59c of FIG. 7 and divide by 8 at 59a of FIG. 7 comb generator outputs.

By referencing all frequency and phase relationships to the common SAW oscillator 80, all frequency and phase changes at the RF output of the microwave synthesizer are phase continuous without any phase breakup. This is a significant attribute of the preferred embodiment because the nature of the DDS 50 is to provide phase continuous frequency changes as its frequency input port data is changed. The only time delay affecting the change of frequency or phase relationships is the propagation delay in the DDS 50 which is currently 24 clock cycles or 24 nanoseconds for a 1 gigahertz clock. This means that the elapsed time from initiation of a change in frequency or phase to a stable output requires 24 nanoseconds. This time is ~40 to 80 times faster than the nearest known competing technology, which is the VTO previously described. The previously described VTO does not have a phase coherent output and otherwise displays frequency instability over temperature and time.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:
1. A microwave frequency synthesizer which comprises:
   (a) a source of combline signals having a plurality of frequency pickets;
   (b) a filter for transmitting therethrough a selected one of said pickets responsive to a predetermined signal thereto;
   (c) IF input providing means;
   (d) combining means combining the selected picket and said IF input to provide upper and lower sidebands displaced by said IF input;
   (e) means to suppress one of said sidebands; and
   (f) an oscillator controlling said source of combline signals and said means providing an IF input.

2. The synthesizer of claim 1 wherein said filter is externally controlled and responsive to a predetermined signal thereto to select said one of said pickets.

3. The synthesizer of claim 1 wherein said combining means is a mixer.

4. The synthesizer of claim 2 wherein said combining means is a mixer.

5. The synthesizer of claim 1 wherein said filter for transmitting therethrough a selected one of said pickets responsive to a predetermined signal thereto and said means to suppress one of said sidebands are both YIG filters.

6. The synthesizer of claim 2 wherein said filter for transmitting therethrough a selected one of said pickets responsive to a predetermined signal thereto and said means to suppress one of said sidebands are both YIG filters.

7. The synthesizer of claim 3 wherein said filter for transmitting therethrough a selected one of said pickets responsive to a predetermined signal thereto and said means to suppress one of said sidebands are both YIG filters.

8. The synthesizer of claim 4 wherein said filter for transmitting therethrough a selected one of said pickets responsive to a predetermined signal thereto and said means to suppress one of said sidebands are both YIG filters.

9. A microwave frequency synthesizer which comprises:
   (a) a source of combline signals having a plurality of frequency pickets;
   (b) a filter for transmitting therethrough a selected one of said pickets responsive to a predetermined signal thereto;
   (c) IF input providing means;
   (d) combining means combining the selected picket and said IF input to provide upper and lower sidebands displaced by said IF input; and
   (e) means to suppress one of said sidebands;
   (f) wherein said filter for transmitting therethrough a selected one of said pickets responsive to a predetermined signal thereto and said means to suppress one of said sidebands are both YIG filters;
   (g) further including a pole piece, both of said YIG filters containing a coil wound around said pole piece.

10. The synthesizer of claim 9 further including an oscillator controlling said source of combline signals and said means providing an RF input.

11. The synthesizer of claim 9 wherein said filter is externally controlled and responsive to a predetermined signal thereto to select said one of said pickets.

12. The synthesizer of claim 11 further including an oscillator controlling said source of combline signals and said means providing an RF input.

13. The synthesizer of claim 9 wherein said combining means is a mixer.

14. The synthesizer of claim 12 wherein said combining means is a mixer.

* * * * *